United States Patent [19]
Gregoire

[11] Patent Number: 5,351,393
[45] Date of Patent: Oct. 4, 1994

[54] METHOD OF MOUNTING A SURFACE-MOUNTABLE IC TO A CONVERTER BOARD

[75] Inventor: George D. Gregoire, San Diego, Calif.

[73] Assignee: Dimensonal Circuits Corporation, San Diego, Calif.

[21] Appl. No.: 913,880

[22] Filed: Jul. 15, 1992

Related U.S. Application Data

[63] Continuation of Ser. No. 706,060, May 28, 1991, abandoned.

[51] Int. Cl.⁵ .............................................. H05K 3/34
[52] U.S. Cl. ...................................... 2.9/835; 29/838; 361/764; 361/774
[58] Field of Search ................. 29/740, 741, 827, 831, 29/832, 835, 838–840, 843, 844; 228/123, 173.1; 257/676, 693, 694, 786; 361/405, 760, 761, 764, 772, 774, 776

[56] References Cited

U.S. PATENT DOCUMENTS

| 4,812,421 | 3/1989 | Jung et al. | 29/827 X |
| 4,816,427 | 3/1989 | Dennis | 357/70 X |
| 4,827,611 | 5/1989 | Pai et al. | 361/405 X |
| 4,831,723 | 5/1989 | Kaufman | 228/123 X |
| 5,030,144 | 7/1991 | Seidler | 439/83 X |

FOREIGN PATENT DOCUMENTS

| 163856 | 12/1985 | European Pat. Off. | 29/827 |
| 3062935 | 3/1991 | Japan | 29/827 |

Primary Examiner—Peter Dungba Vo
Attorney, Agent, or Firm—Bernard L. Kleinke; Jerry R. Potts

[57] ABSTRACT

A surface-mount integrated circuit converter board assembly having a pin grid array arranged enables a conventional surface-mount lead device to be mounted for subsequent attachment to a printed circuit board. The converter board assembly includes an array of spaced apart pins, arranged in rows and columns for mounting, and a plurality of spaced apart pin pads connected thereto. The pin pads are sufficiently spaced apart to avoid interference. A set of surface-mount lead pads is part of the converter board and is interconnected to the array of pins by a plurality of lead traces. The method of making the converter board with a surface-mount integrated circuit device includes forming or reforming the leads of the device to align with the surface-mount pads.

8 Claims, 4 Drawing Sheets

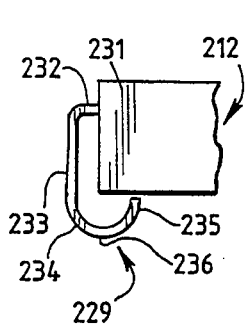
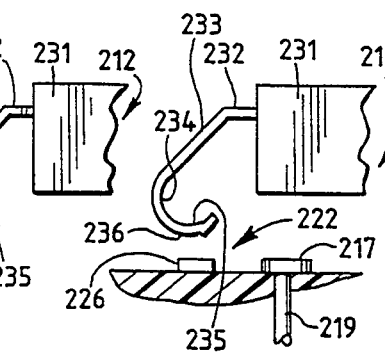
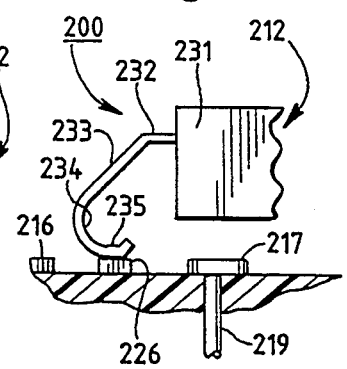
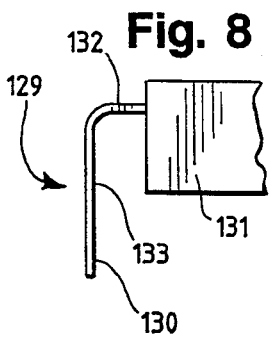
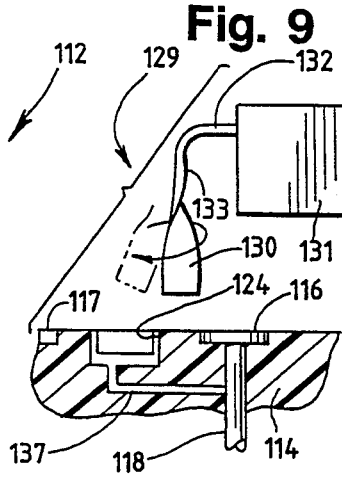
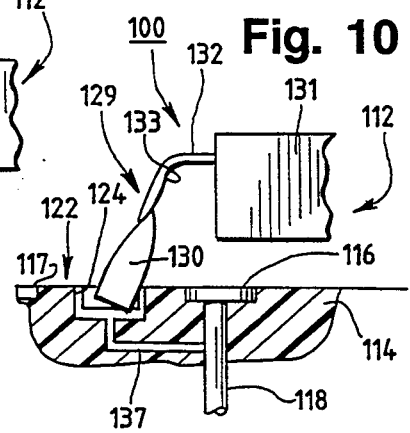
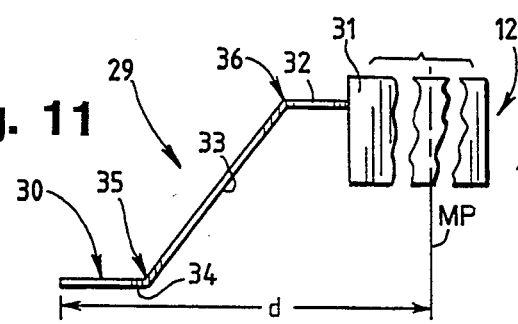
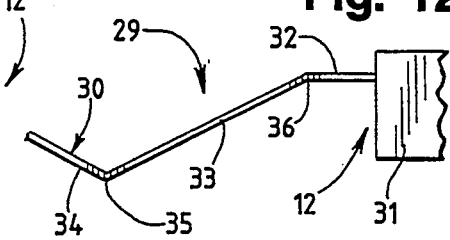
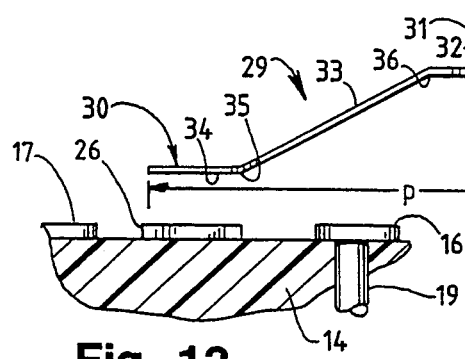
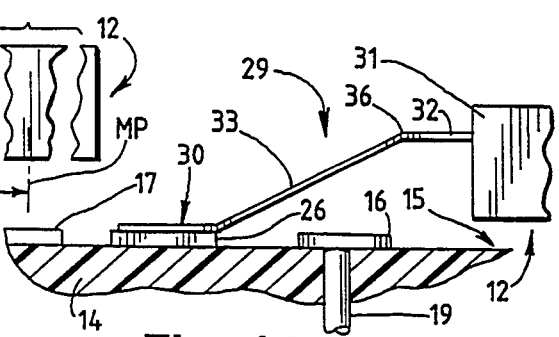

METHOD OF MOUNTING A SURFACE-MOUNTABLE IC TO A CONVERTER BOARD

This is a continuation, of application Ser. No. 07/706,060, filed on May 28, 1991.

TECHNICAL FIELD

The present invention relates, in general to an improved converter board assembly, and method of making it. It more particularly relates to such an assembly and method for enabling a surface-mount integrated circuit device to be converted to a pin grid array through hole device in an efficient and cost effective manner.

BACKGROUND ART

Today's modern integrated circuit technology has resulted in many different types and kinds of mounting techniques for connecting an integrated circuit device or integrated circuit to a printed circuit board.

For examples of various different types and kinds of integrated mounting arrangements and techniques are disclosed in the following U.S. Pat. Nos.: 3,825,999; 4,674,007 and 4,859,190.

In general, surface mount integrated circuit devices can be either mounted directly to a printed circuit board by a conventional soldering technique, or integrated within a pin grid array (PGA) for "through hole" removable mounting purposes, or the PGA can even be surface mounted.

Such pin grid array devices include a plurality of closely spaced apart through hole mounting pins for enabling a centrally disposed, integrally formed integrated circuit to be adapted for through hole mounting or surface mounting.

The pin grid array devices are relatively expensive to manufacture, and thus the cost to the ultimate consumer may be excessive for some applications. On the other hand, surface-mount integrated circuit devices, such as gull wing packages, are oftentimes relatively less expensive to manufacture, even though the integrated circuitry embedded within the semiconductor die may be substantially identical to the circuitry embedded within a corresponding pin grid array integrated circuit device.

Therefore, it would be highly desirable to be able to convert a lower priced surface-mount device into a higher priced pin grid array device. The resulting converted pin grid array device could then be sold as a replacement device to be used in place of conventional pin grid array devices, since the two devices would be functionally substantially identical to one another.

However, there is a problem in converting surface-mount devices to pin grid array devices. In this regard, it would be very difficult, if not impossible, to connect physically and electrically the finely spaced surface-mount leads to a set of pins arranged in a standard pin grid array for a given integrated circuit. The pin arrangement for a given application is fixed, and has a different spacing and layout from the fine spacing of the surface-mount leads. Thus, it would often be impossible or at least extremely difficult to superimpose the surface-mount leads of a given integrated circuit into a position adjacent to a set of pins arranged according to a desired pin grid array arrangement, without contacting at least some of the pins. In other words, in order to accomplish the conversion, it would be necessary for all of the surface-mount leads to be positioned without touching them, so that conductors can be used to interconnect the leads with corresponding individual ones of the pins.

The lead footprints of a conventional surface-mount integrated circuit are so closely spaced that a multiple number could contact a single pin or its annular pad of conductive material. Moreover, even if it were somehow possible to avoid contacting the pin, the other surface-mount leads or other sides of the integrated circuit would still make unwanted one or more connections with a single pin.

Therefore, it would be highly desirable to have a new and improved method and assembly for enabling a conventional surface-mount technology integrated circuit to be converted to a given desired pin gird array device in a cost effective and efficient manner.

DISCLOSURE OF INVENTION

Therefore, the principal object of the present invention is to provide a new and improved surface-mount integrated circuit converter board assembly and method of making it to enable a conventional surface-mount lead integrated circuit to be adapted for mounting to a printed circuit board through a "through-hole" or surface mounting technique.

Another object of the present invention is to provide such a new and improved converter board assembly and method of making it to enable a conventional surface-mount lead integrated circuit to be mounted to a printed circuit board according to a relatively inexpensive-to-manufacture technique in an effective and efficient manner.

Briefly, the above and further objects of the present invention are realized by providing a new and improved converter board assembly and method of making it, to enable a conventional surface-mount lead integrated circuit, such as a gull-wing integrated circuit, to be mounted for attachment to a printed circuit board. The converter board assembly includes an array of spaced apart pins, arranged in rows and columns for mounting, and a plurality of spaced apart pads connected thereto. Surface-mount lead pads are mounted on the converter board between the pin pads and are interconnected to the array of pins by a plurality of lead traces. The method of making the converter board with a surface-mount integrated circuit device includes forming or reforming the leads of the device to align with the surface-mount lead pads.

BRIEF DESCRIPTION OF DRAWINGS

The above mentioned and other objects and features of this invention and the manner of attaining them will become apparent, and the invention itself will be best understood by reference to the following description of the embodiments of the invention in conjunction with the accompanying drawings, wherein:

FIGS. 4–7 are partially diagrammatic views of a method of making another surface mount integrated circuit converter board assembly according to the present invention;

FIGS. 8–10 are partially diagrammatic views of a method of making still another surface-mount integrated circuit convertor board assembly, according to the present invent;ion FIGS. 11–14 are partially diagrammatic views of a method of making the surface-mount integrated circuit converter board assembly of FIG. 3 in accordance with the present invention.

BEST MODE FOR CARRYING OUT THE INVENTION

Figure 1:
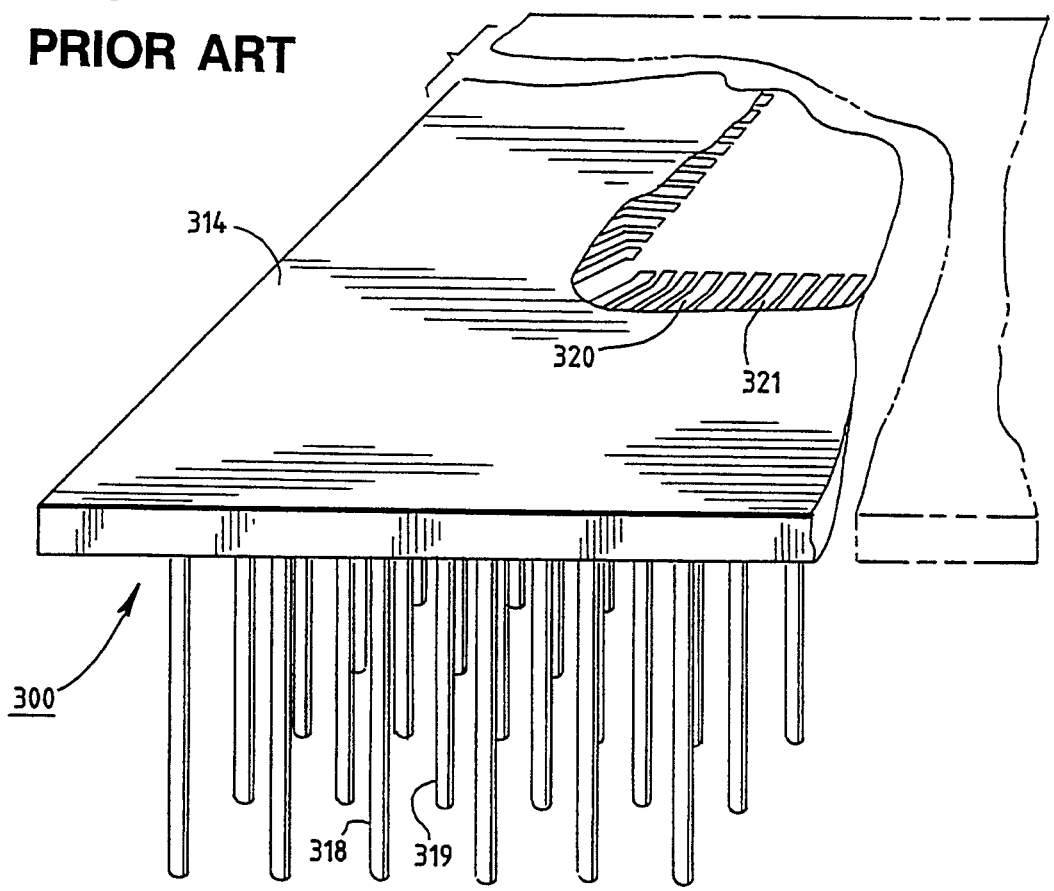
FIG. 1 is fragmentary pictorial view of a prior art pin grid array integrated circuit device.
Figure 2:
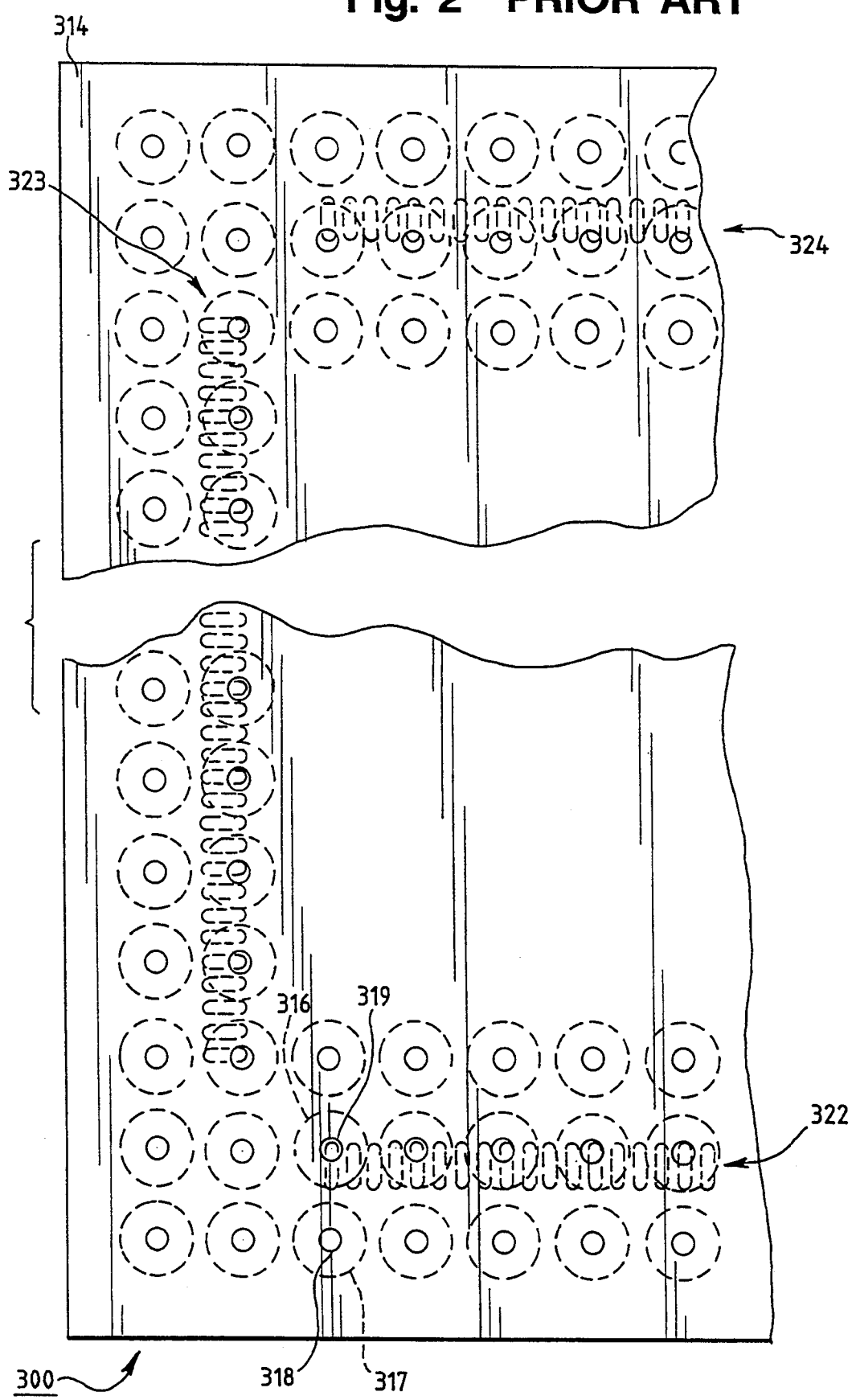
FIG. 2 is an enlarged fragmentary bottom plan view of the pin grid array device of FIG. 1, illustrating the spacing of pin pads relative to the footprints of foot portions of a conventional gull-wing integrated circuit illustrated broken lines.

As best seen in FIGS. 1 and 2, a prior art pin grid array adapter device 300 generally includes an integrally formed pattern of conductive pads, such as pads 320 and 321, interconnected with a set of through hole mounting pins such as the pins 318 and 319. An integrated circuit (not shown) is centrally mounted and connected electrically to the pads. The mounting pins project in a spaced apart manner from the underside of a substrate 314. As shown in broken lines in FIG. 2, spaced apart circular pin pads, such as the pads 316 and 317 are disposed and electrically connected at the top or bottom ends of the individual ones of the pins within the substrate 314. The integrated circuit (not shown) includes a set of leads which are interconnected to individual ones of the pins, as is well known in the art.

FIG. 2 illustrates in phantom lines the positional locations of four rows of conventional foot portions, such as the three rows 322–324 of gull-wing leads of a surface-mount integrated circuit device (not shown) relative to the pin grid arrangement of such prior known device 300. As indicated in FIG. 2, the four rows of finely spaced gull-wing lead foot portions are superimposed and overlay the pin pads, such as the pad 316, thereby making it impossible to individually connect electrically each one of the gull-wing leads to desired ones of the pins. The present invention, on the other hand, discloses a new and improved surface-mount integrated circuit converter board assembly which is dimensioned and constructed to enable the mounting of a conventional surface-mount technology integrated circuit to a pin grid array through-hole printed circuit board.

Referring now to the drawings, and more particularly to FIGS. 3, 11–14 and 15 thereof, there is shown a surface-mount integrated circuit converter board assembly 10, which is constructed in accordance with the present invention. The assembly 10 is used according to the method of the present invention to mount a surface-mount gull-wing lead device or integrated circuit 12 by known techniques.

The converter board assembly 10 generally comprises a converter board 13 having a substrate 14 with a plurality of pin pads, such as pin pads 16 and 17 and a plurality of through hole mounting pins, such as a pin 18 and 19. The pins are arranged in an array of rows and columns that is substantially similar to the pins on a conventional pin grid array device. Each pin, such as the pin 18 is mounted within an associated pin pad and extends completely through the substrate 14 terminating at a predetermined distance "a" from the undersurface of the substrate 14. The distance "a" is chosen for proper through hole mounting or surface mounting of the pins on a printed circuit board (not shown).

Figure 3:
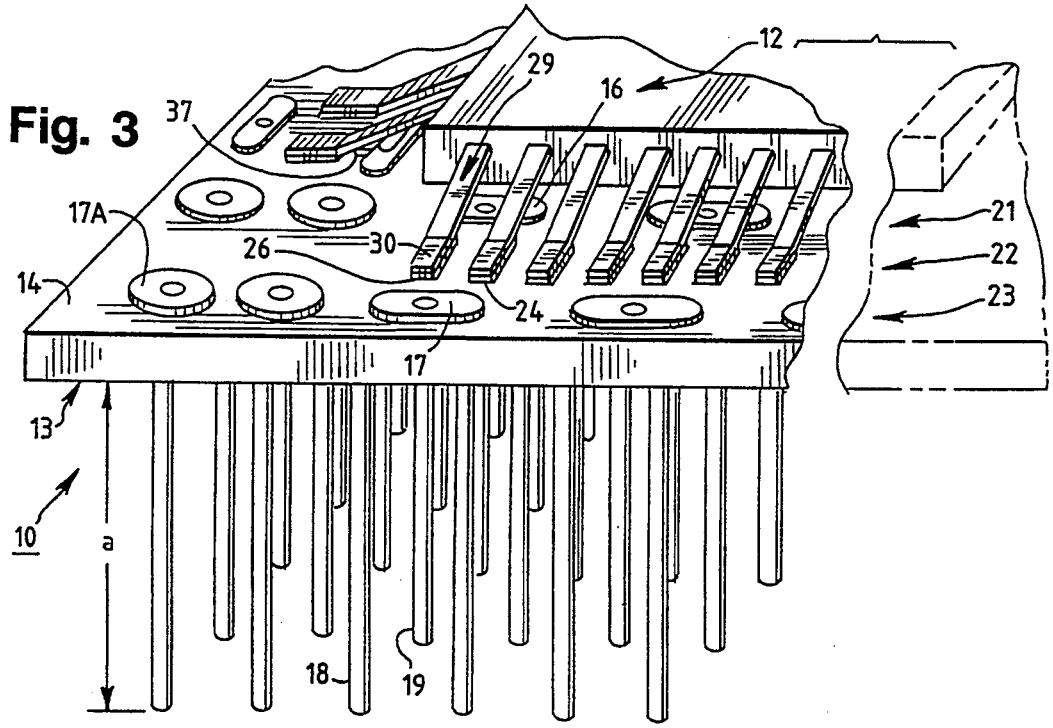
FIG. 3 is a fragmentary pictorial view of a surface mount integrated circuit converter .assembly, which is constructed accordance with the present invention.
Figure 15:
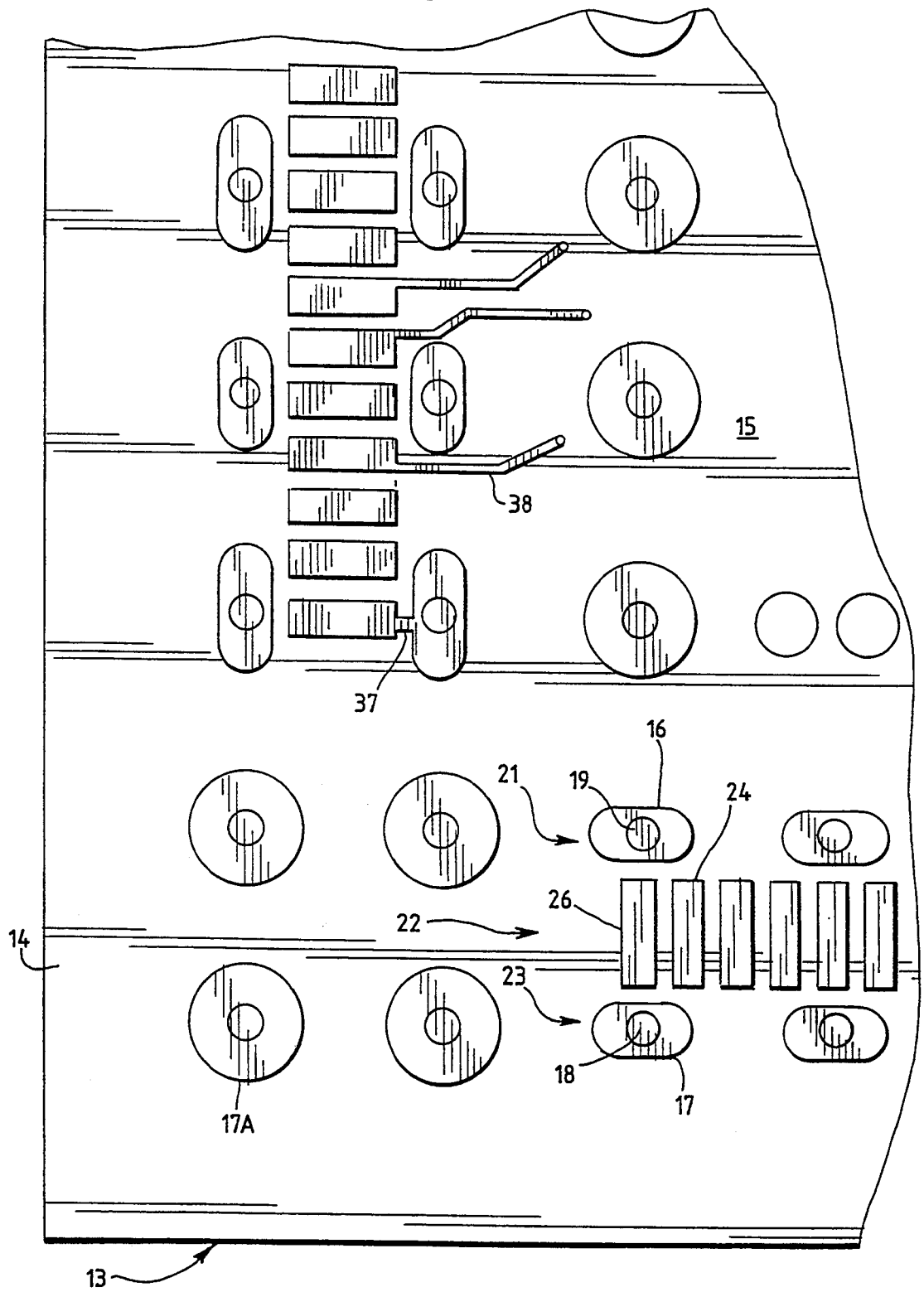
FIG. 15 is an enlarged fragmentary top view of the surface-mount integrated circuit converter board assembly of FIG. 3, with the surface-mount integrated circuit removed therefrom for illustration purposes.

As best seen in FIGS. 3 and 15, the pads, such as the pads 16 and 17 are arranged in pairs of spaced apart rows such as rows 21 and 23. Some of the individual pads, such as pad 16, are configured in a non-circular shape such as an oval shape, for providing a sufficient mounting area space, such as the mounting area space 22 between the rows of pins. It should be noted that where spacing allows, conventional circular pin pads, such as a corner pin pad 17A, are provided. The space 22 is sufficiently large for mounting a row of surface-mount lead pads, such as a lead pad 24 and 26. In this regard, the lead pads are closely spaced apart and are configured in a general rectangular shape that corresponds to the shape of a gull-wing lead foot 30 extending from the surface-mount integrated circuit.

As best seen in FIGS. 3 and 15, for the purpose of providing an electrical connection between the individual ones of the pin pads, such as the pin pad 16, and the individual ones of the lead pads, such as the lead pad 24, the board assembly 10 also includes a plurality of conductor traces, such as trace 37 and 38, which are on the surface of the substrate 14. The conductor traces, such as traces 37 and 38, are laid out in the substrate 14 by hand or by a conventional computer aided design program that assures that each trace provides a single conduction path between a pin pad and a lead pad without contacting any other trace or pin, when desired. According to known techniques, the traces sometimes extend through multiple substrate layers between desired ones of the lead pads and pin pads to provide the desired electrical interconnections between the integrated circuit leads and the pins according to the circuitry design of the integrated circuit 12. The pins and interconnecting traces thus adapt a conventional surface-mount integrated circuit, such as the integrated circuit 12, for known mounting.

Considering now the method of securing the integrated circuit 12 to the substrate 14, with reference to FIGS. 3 and 11–14, the integrated circuit 12 is a conventional surface-mount integrated circuit with a plurality of gull-wings leads, such as a gull-wing lead 29 (FIG. 3). As shown in FIG. 11, the tip or toe of the foot 30 of the gull-wing lead 29 extends from the central midplane "MP" of a body portion 31 of the integrated circuit by a distance "d."

As best seen in FIGS. 11–14, prior to mounting the integrated circuit 12 to the converter board, the gull-wing lead 29 includes a shoulder portion 32 which extends from the body portion 31 to an angularly depending thigh portion 33 terminating in the foot 30. The foot 30 has a sole 34 configured in a shape corresponding to a given lead pad, such as the pad 26.

In order to cause the foot 30 and its sole 34 to be brought into mating alignment with the associate lead pad 26, according to the inventive method, as indicated in FIG 12, the lead is formed or reformed to enable the foot to engage its pad, by first bending the thigh portion 33 upwardly and away from the body portion 31 about a fulcrum point 36 between the shoulder 32 and the thigh 33. In this regard, the thigh 33 is displaced by a sufficient distance so that an ankle portion 35 of the foot 30 will be adapted to engage the pad 26 when the body 31 is positioned in a body receiving area 15 (FIGS. 14 and 15) on the substrate 14.

To provide complete contact between the pad 26 and the sole 34, as indicated in FIG. 13, the foot 30 is bent downwardly a sufficient distance into a position parallel with the body portion 31, to cause the foot 30 to be in substantially parallel alignment with the pad 26. As shown in FIG. 13, the lead pads, such as pads 24 and 26, are disposed at a distance "p" relative to the midplane of the substrate 14. Thus, it will be understood from the foregoing that the gull-wing is displaced from its unreformed configuration of FIG. 11 by a distance "t" (not shown) relative to the midplane MP of the integrated circuit; where the distance t is given by the following formula:

$$t = p - d \tag{1}$$

Once the foot 30 is positioned in parallel alignment with the pad 26, the sole 34 of the foot 30 is placed on the pad 26 and connected thereto by any conventional technique, such as a wave solder or a reflow soldering technique.

Referring now to FIG. 10 there is shown another surface-mount lead converter board assembly 100 which is constructed in accordance with the present invention. The assembly 100 is used according to another method of the present invention to mount a surface-mount butt lead device or integrated circuit 112 by a lead-in-groove technique.

The converter board assembly 100 generally comprises a substrate 114 having a plurality of pin pads, such as a pin pad 116 and 117 and a plurality of through hole mounting pins, such as a pin 118, arranged in an array of rows and columns. The pins, such as the pin 118, extend from their associated pads through the substrate 114 and terminate at a predetermined distance from the underside of the substrate 114 for proper through hole circuit board assembly (not shown).

The pin pads, such as the pads 116 and 117 are arranged in pairs of spaced apart rows as in the same manner described with reference to board assembly 10. The pin pads may have an elongated oval shape for providing a sufficient mounting area space 122. In this regard, the space 122 is sufficiently large for accommodating a row of recessed lead groove wells, such as a lead well 124. The wells are closely spaced apart and are interconnected to the pins pads by a series of traces, such as a trace 137. Each well, such as well 124 is dimensioned to receive therein a lead foot such as a lead foot 130 extending from a surface-mount integrated circuit, such as the integrated circuit 112.

Considering now the method of securing the integrated circuit 112 to the substrate 114 with reference to FIGS. 8-10, the integrated circuit 112 is a conventional surface-mount integrated circuit with a plurality of butt leads, such as a butt lead 129. The butt lead 129 has a generally elongated rectangular shape with a shoulder portion 132 extending perpendicularly outwardly from a body portion 131 of the integrated circuit. The butt lead 129 also includes the foot 130 which is integrally connected to a calf portion 133.

In order to orient the foot 130 so that it will be easily and quickly received within an associated one of the narrow slot wells, such as well 124, the calf portion 133 is twisted by about 90° (FIG. 9) along its longitudinal axis until the foot 130 is in alignment with the well 124. Once the foot 130 is so positioned, the foot 130 is placed within the well so that it may be subsequently soldered therein by any conventional connection technique such as a soldering technique.

Referring now to FIG. 7 there is shown another surface-mount lead converter assembly board 200 which is constructed in accordance with the present invention. The assembly board 200 is substantially similar to assembly board 10 except that it is used according to another method of the present invention to mount a surface-mount J lead device or integrated circuit 212. The assembly board 200 includes a set of spaced apart pin pads, such as pads 216 and 217 and a set of lead pads, such as a pad 226. The lead pads are arranged in rows that are disposed in mounting areas, such as a mounting area 222, that are defined by the space between the pin pads, such as the space between pin pads 216 and 217. Alternatively, the lead pads may be arranged solely outside the outer row of pin pads. Each pin pad has an associated pin, such as a pin 219.

Considering now the method of securing the integrated circuit 212 to the substrate 214 with reference to FIGS. 4-7, the integrated circuit 212 is a conventional surface-mount integrated circuit having a plurality of J leads, such as a J lead 229. The J lead 229 includes a shoulder portion 232 that extends perpendicularly outwardly from a body portion 231 of the integrated circuit. The shoulder 232 terminates in an integrally connected calf portion 233 that extends downwardly and toward the lower portion of the body 231. The calf 233 terminates in a foot portion 234 that is generally U shaped. The U shape of the foot 234 causes a toe portion 235 of the foot 234 to be disposed below the underside of the body 231.

In order to cause the foot 234 and toe 235 to be brought into mating alignment with its associated lead pad 226, the calf 233 is displaced outwardly and away from the body portion 231. In this regard, the calf 233 is displaced a sufficient distance so that an underside or sole portion 236 of the foot will engage the pad 226 when the body 231 is positioned on the substrate 214.

To provide contact between the pad 226 and the sole portion 236 of the foot, the toe portion 235 of the foot is bent upwardly a sufficient distance to cause the sole 236 to be in substantial parallel alignment with the pad 226. Once the sole 236 is in alignment with the pad 226, the sole 236 is placed on the pad 226 and connected thereto by any conventional technique, including soldering.

While particular embodiments of the present invention have been disclosed, it is to be understood that various different modifications are possible and are contemplated within the true spirit and scope of the appended claims. For example, the present invention contemplates various different types and kinds of interconnection techniques including, but not limited to, forced frictional mechanical connections, as well as conductive adhesive materials, such as conductive epoxies. There is no intention, therefore, of limitations to the exact abstract or disclosure herein presented.

What is claimed is:

1. A method for mounting a gull wing surface-mountable integrated circuit to a converter board having a central midplane at a body receiving area for the integrated circuit and a plurality of lead pads disposed at distances p from the central midplane of said board, comprising:

holding in a stationary manner the integrated circuit, the integrated circuit having a body portion with another central midplane and a plurality of gull-wing leads arranged in pairs of groups extending an unreformed distance d from the body portions midplane in diametrically opposing directions from the body portion;

said gull-wing leads having shoulders, thighs and foot portions with integrally connected ankle portions;

moving the ankle portions of the plurality of gull-wing leads upwardly and away from the body portion about a fulcrum point defined between the shoulders and the thighs of the individual ones of said plurality of leads;

said shoulders extending perpendicularly outwardly from said body portion terminating in integrally connected thighs extending downwardly angularly therefrom at an angle substantially greater than 90 degrees, said thighs being integrally connected at opposite ends to ankle portions with foot portions extending therefrom in a plane substantially parallel with said shoulders;

moving the foot portions of the plurality of gull-wing leads about the ankle portions a sufficient distance to be substantially disposed in a parallel plane with said shoulder portions and to reform the leads to cause the foot portions to be disposed at distances from the central midplane of the body portion substantially equal to the distance p;

securing the foot portions onto individual ones of the lead pads of said plurality of lead pads.

2. The method according to claim 1, wherein said securing includes:

placing underside portions of the individual foot portions of the integrated circuit onto individual corresponding ones of the lead pads of said plurality of lead pads; and soldering the individual foot portions to the individual corresponding ones of the lead pads.

3. A method for mounting a surface-mountable integrated circuit to a converter board having a plurality of recessed pads, the integrated circuit having a body portion and a plurality of butt leads arranged in pairs of groups, each one of said butt leads having shoulders integrally connected at one end to the body portion and to calf portions at the other end, said calf portions having integrally connected foot portions extending downwardly coextensively therefrom, comprising:

twisting the calf portions about their longitudinal axis to cause the foot portions to be rotated to an angle about 90 degrees; said shoulders extending perpendicularly outwardly from the body portion terminating in the calf portions extending downwardly angularly therefrom and at an angle substantially equal to 90 degrees;

moving the calf portions of the plurality of butt leads upwardly and outwardly away from the body portion about a fulcrum point defined between the shoulders and the calf portions of the individual ones of said plurality of leads;

placing individual ones of the foot portions of the plurality of butt leads within individual ones of the plurality of recessed pads;

securing the individual foot portions of the integrated circuit in the individual ones of the corresponding recessed pads of said plurality of recessed pads.

4. The method for mounting a surface-mountable integrated circuit according to claim 3, wherein said securing includes:

soldering the individual foot portions within the individual ones of the recessed pads.

5. The method for mounting a surface-mountable integrated circuit according to claim 3, wherein said twisting includes twisting the calf portions about their longitudinal axis by about 90 degrees.

6. A method of mounting a surface-mountable integrated circuit to a converter board having a substrate with a central midplane and a body receiving area for the integrated circuit and a plurality of lead pads disposed a distance p from the central midplane of said substrate, the surface-mountable integrated circuit having a body portion with another central midplane and a plurality of leads having foot portions with soles, the plurality of leads extending from the body portion and terminating at a distance d from the another central midplane, where the distance p is substantially greater than the distance d, comprising:

bending the plurality of leads extending from the body portion outwardly so that a distal portion of each individual one of the leads are displaced from their initial position by a distance t relative to the central midplane of the integrated circuit, where the distance t is defined by the following formula $t = p - d$; and securing the individual ones of the leads to corresponding individual ones of the lead pads;

whereby the leads of the integrated circuit are reformed so that the integrated circuit may be mounted to the converter board to convert the integrated circuit to a pin grid array device.

7. The method for mounting according to claim 6, further comprising:

bending the individual ones of the leads downwardly to cause the foot portions to be in substantial parallel alignment with corresponding lead pads.

8. The method for mounting according to claim 6, further comprising:

bending a portion of each of the foot portions of each individual one of the leads upwardly to cause a substantial portion of the sole of each individual one of the leads to conform to the shape and size of individual ones of the lead pads.

* * * * *